United States Patent
Oh

(10) Patent No.: US 7,791,392 B2
(45) Date of Patent: Sep. 7, 2010

(54) APPARATUS AND METHOD FOR GENERATING INTERNAL SIGNAL WITH VARIABLE PULSE LENGTH ACCORDING TO PERIOD OF EXTERNAL CLOCK SIGNAL

(75) Inventor: Young-Hoon Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 922 days.

(21) Appl. No.: 11/646,343

(22) Filed: Dec. 28, 2006

(65) Prior Publication Data
US 2007/0285443 A1 Dec. 13, 2007

(30) Foreign Application Priority Data
Jun. 7, 2006 (KR) .................. 10-2006-0051015

(51) Int. Cl.
*H03K 3/00* (2006.01)
(52) U.S. Cl. ...................... 327/291; 327/294
(58) Field of Classification Search ................. 327/291, 327/293, 294, 298, 299
See application file for complete search history.

(56) References Cited

U.S. PATENT DOCUMENTS

| | | | |
|---|---|---|---|
| 5,920,211 A | | 7/1999 | Anderson et al. |
| 6,114,891 A | * | 9/2000 | Kim ........................... 327/172 |
| 6,178,123 B1 | | 1/2001 | Kato et al. |
| 6,222,393 B1 | * | 4/2001 | Shah et al. .................. 327/34 |
| 6,339,553 B1 | | 1/2002 | Kuge |
| 6,417,715 B2 | | 7/2002 | Hamamoto et al. |
| 7,030,671 B2 | * | 4/2006 | Park .......................... 327/172 |
| 7,319,355 B2 | * | 1/2008 | Wu et al. .................... 327/291 |
| 7,446,586 B2 | * | 11/2008 | Park .......................... 327/291 |
| 2006/0044037 A1 | | 3/2006 | Gomm et al. |

FOREIGN PATENT DOCUMENTS

| | | |
|---|---|---|
| JP | 11-31952 | 2/1999 |
| JP | 2001-351381 | 12/2001 |
| JP | 2001344972 | 12/2001 |
| JP | 2005-18739 | 1/2005 |
| KR | 1020000004529 A | 1/2000 |

* cited by examiner

*Primary Examiner*—Hai L Nguyen
(74) *Attorney, Agent, or Firm*—Venable LLP; Jeffri A. Kaminski

(57) ABSTRACT

An apparatus for generating a pulse which generates an internal signal. The apparatus includes a latch circuit latching an input signal to output a first signal. A clock period detector detects a period of an external clock signal to output a period detecting signal and a delay controller adjusts a delay time of the first signal to output a second signal in response to the period detecting signal. A signal generator receives the first signal and the second signal to output a pulse signal.

28 Claims, 6 Drawing Sheets

APPARATUS AND METHOD FOR GENERATING INTERNAL SIGNAL WITH VARIABLE PULSE LENGTH ACCORDING TO PERIOD OF EXTERNAL CLOCK SIGNAL

FIELD OF THE INVENTION

1. Technical Field

The present invention relates to an apparatus and method for generating internal signals, and more particularly, to an apparatus and method capable of stably generating internal signals.

2. Related Art

In a semiconductor integrated circuit using an activated interval of an external input signal having a relatively long period, when only some of the activated interval is used, the rest activated interval is unnecessarily activated. Therefore, the current consumption of the semiconductor integrated circuit is increased.

In contrast, if the activated interval of the input signal is relatively short, the semiconductor integrated circuit can not sufficiently use the active interval of the input signal. Therefore, the semiconductor integrated circuit may malfunction.

Recent semiconductor memory integrated circuits have a pulse generating apparatus for adjusting the period of the input signal built into the circuit, so that the input signal desired by the circuit can be obtained.

Such a conventional pulse generating apparatus, as shown in FIG. 1, may include a first NAND gate ND1 receiving an input signal IN_SIG, a second NAND gate ND2 having a latch structure with the first NAND gate ND1, a delay part 10 having its input terminal connected to an output terminal of the first NAND gate ND1, a third NAND gate ND3 of which one input terminal is connected to the output terminal of the first NAND gate ND1 and the other input terminal is connected to an output terminal of the delay part 10 and an input terminal of the second NAND gate ND2, and an inverter IV1 of which an input terminal is connected to an output terminal of the third NAND gate ND3 and outputting an output signal OUT_SIG at its output terminal.

FIG. 2 is a timing diagram illustrating the operation of the conventional pulse generating apparatus of FIG. 1.

In such a pulse generating apparatus, the input signal IN_SIG, a second signal B_SIG as a signal of a second node B, and a third signal C_SIG as a signal of a third node C have initial values of high level at an initial time t0. The first signal A_SIG of the first node A and the output signal OUT_SIG have low levels, and the input signal IN_SIG is input as a pulse of low level. In addition, the delay part 10 delays the first signal A_SIG by a predetermined time td and inverts it.

When the first signal A_SIG is inverted to a high level, the input signal IN_SIG is inverted to a low level. The third signal C_SIG output from the second NAND gate ND2 receiving the first signal A_SIG of high level and the second signal B_SIG of high level is inverted from a high level to a low level. In addition, the output signal OUT_SIG, is inverted from a low level to a high level. These operations correspond to operations up to a first time t1.

As the first signal A_SIG is delayed by a predetermined time td by the delay part 10 and is inverted, the second signal B_SIG is inverted to a low level after the predetermined time td has passed. As the second signal B_SIG is inverted to a low level, the output signal OUT_SIG is inverted to a low level, and the third signal C_SIG is inverted to a high level. In addition, the first signal A_SIG is inverted to a low level by the first NAND gate ND1 which receives the third signal C_SIG and the input signal IN_SIG initialized to a high level. These operations correspond to operations up to a second time t2.

These signals at a third time t3 have the same levels as the respective initial times t0.

That is, the input signal IN_SIG having a pulse width tin is output as an output signal OUT_SIG having an activated interval tout by the predetermined time td, and the first to third signals A_SIG, B_SIG, C_SIG, the input signal IN_SIG, and the output signal OUT_SIG return to their initial levels after the predetermined time td has passed.

FIG. 3 is a timing diagram of a conventional pulse generating apparatus when the period of the external clock signal is sufficiently long.

In FIG. 3, for example, the input signal assumes the signal that generated in a chip by inputting command per two cycle of the external clock signal CLK. When the period of the external clock signal CLK is sufficiently long, the pulse generating apparatus normally outputs the output signal OUT_SIG and is initialized by the incoming input signal IN_SIG synchronized with the external clock signal CLK while the first to third signals A_SIG, B_SIG, C_SIG are already initialized. The pulse generating apparatus then normally outputs the output signal OUT_SIG by means of the incoming input signal IN_SIG after two clocks have passed.

FIG. 4 is a timing diagram of a conventional pulse generating apparatus when the period of the external clock signal is short.

As shown in FIG. 4, when the period of the external clock signal CLK is short, the input signal IN_SIG becomes activated by the next command before the second signal B_SIG has a high level as its initial state, so that the first signal A_SIG is inverted to a high level due to the input signal IN_SIG.

However, the second signal B_SIG has a low level, so that the output signal OUT_SIG can not be activated. As such, the delay time td of the delay part 10 in the conventional pulse generating apparatus is fixed, so that it is difficult to generate the output signal OUT_SIG with a pulse shape when the period of the external clock signal CLK is short. Therefore, reliability on operations of a semiconductor integrated circuit is degraded and the semiconductor integrated circuit can not operate in a stable manlier.

SUMMARY OF THE INVENTION

An embodiment of the present invention is provided for a pulse generating apparatus and method, which can stably generate an internal signal by flexibly adjusting a delay time.

An embodiment of the present invention provides a pulse generating apparatus comprising: a latch circuit latching an input signal to output a first signal; a clock period detector detecting a period of an external clock signal to output a period detecting signal; a delay controller adjusting a delay time of the first signal to output a second signal in response to the period detecting signal; and a signal generator receiving the first signal and the second signal to output a pulse signal.

Another embodiment of the present invention provides a method of generating a pulse, comprising: latching an input signal to output a first signal;

detecting a period of an external clock signal to output a plurality of period detecting signals; adjusting a delay time of the first signal to output a delayed second signal in response to the plurality of period detecting signals; and generating a pulse signal in response to the first signal and the second signal.

A further understanding of the nature and advantages of the present invention herein may be realized by reference to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF EXEMPLARY EMBODIMENTS

Figure 1:
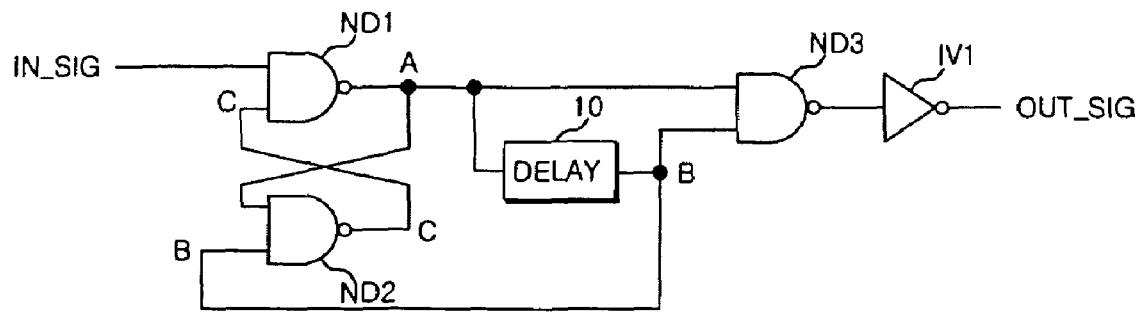
FIG. 1 is a block diagram of a conventional pulse generating apparatus.
Figure 2:
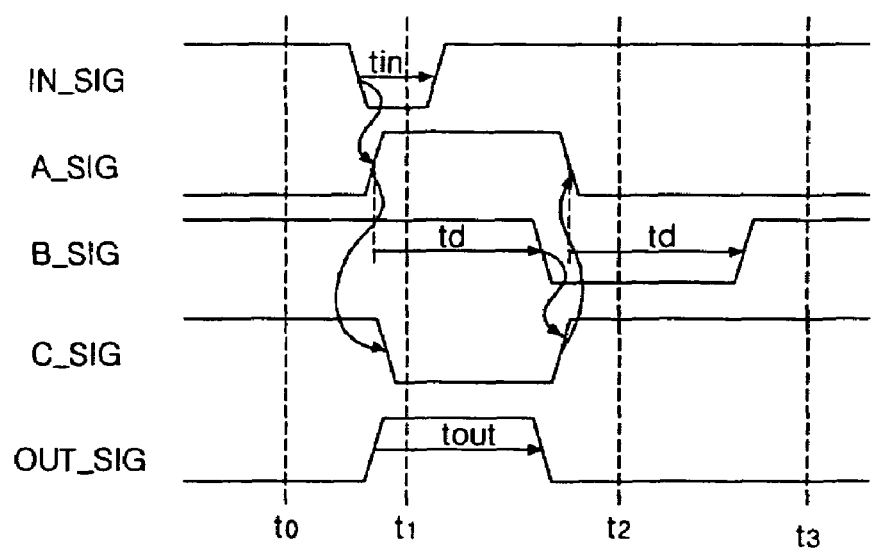
FIG. 2 is a timing diagram illustrating the operation of the conventional pulse generating apparatus of FIG. 1.
Figure 3:
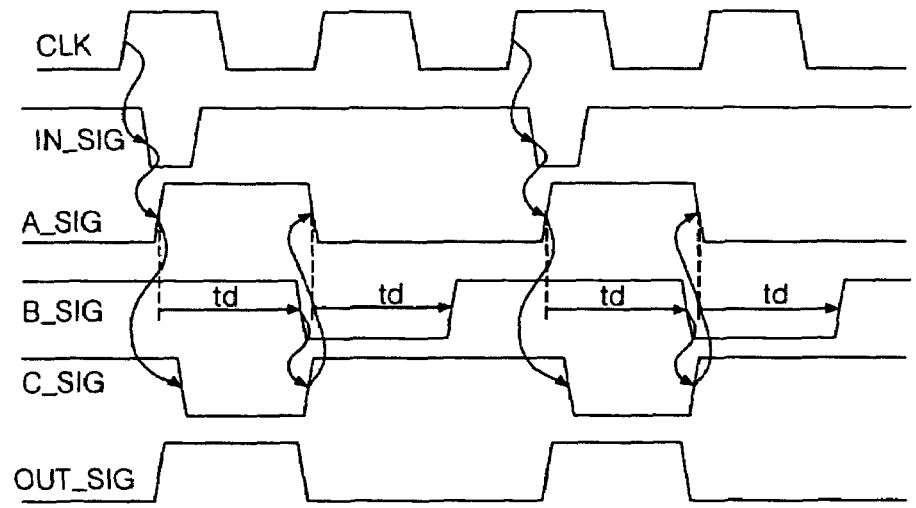
FIG. 3 is a timing diagram of a conventional pulse generating apparatus when a period of an external clock signal is sufficiently long.
Figure 4:
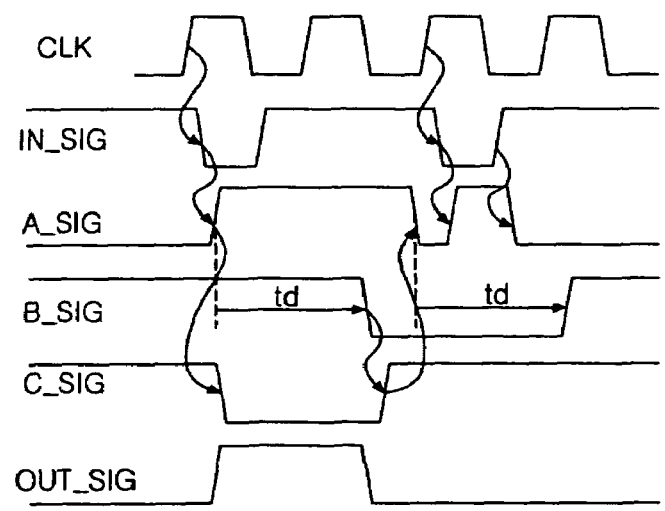
FIG. 4 is a timing diagram of a conventional pulse generating apparatus when a period of an external clock signal is short.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Hereinafter, it will be described about an exemplary embodiment of the present invention in conjunction with the accompanying drawings.

Figure 5:
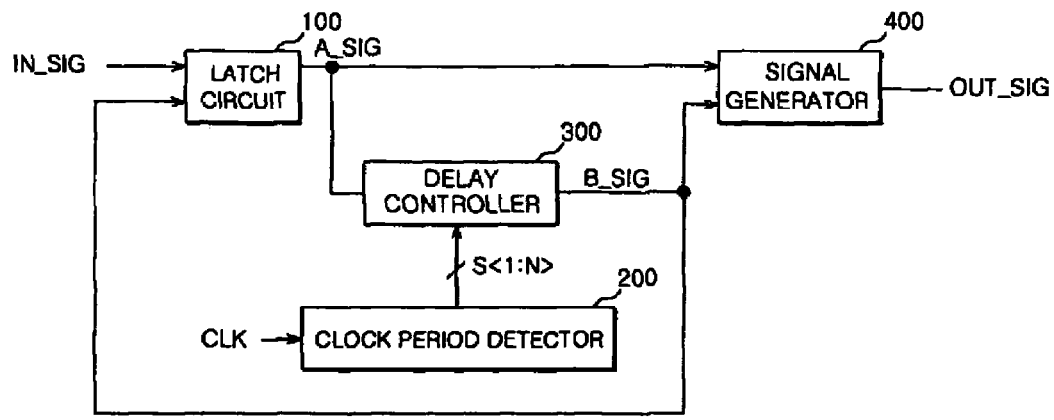
FIG. 5 is a block diagram of a pulse generating apparatus according to an embodiment of the present invention.

Referring to FIG. 5, a pulse generating apparatus may include a latch circuit 100, a clock period detector 200, a delay controller 300, and a signal generator 400.

Figure 6:
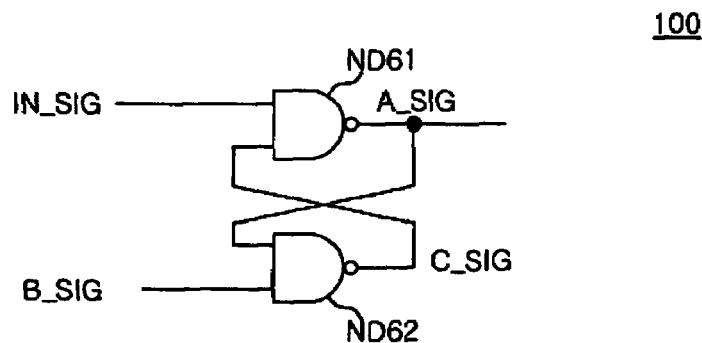
FIG. 6 is a circuit diagram of the latch circuit of FIG. 5.

The latch circuit 100 outputs a first signal A_SIG in response to an input signal IN_SIG and a second signal B_SIG. This latch circuit 100, as shown in FIG. 6, may include a first NAND gate ND61 having one input terminal which receives the input signal IN_SIG, the other input terminal which receives a third signal C_SIG, and an output terminal which outputs the first signal A_SIG; and a second NAND gate ND62 having one input terminal which receives the first signal A_SIG, the other input terminal which receives the second signal B_SIG, and an output terminal which outputs the third signal C_SIG.

The latch circuit 100 of the present invention is implemented with a latch structure comprised of the first NAND gate ND61 and the second NAND gate ND62. However, the latch circuit is not limited to the above-described embodiment and it is clearly understood that the latch circuit 100 may be varied in accordance with characteristics of any given circuit.

The clock period detector 200 detects a period of an external clock signal CLK to output N period detecting signals S<1:N>. The N period detecting signals S<1:N> output from the clock period detector 200 correspond with the period of the external clock signal CLK. Further, only one of the N period detecting signals S<1:N>, which corresponds the external clock signal CLK, is activated in accordance with the period of the external clock signal CLK. A detailed structure of the clock period detector 200 will be described below.

The delay controller 300 adjusts a delay time of the first signal A_SIG in accordance with the N period detecting signals S<1:N> to output the second signal B_SIG. A detailed structure of the delay controller 300 will also be described below.

Figure 7:
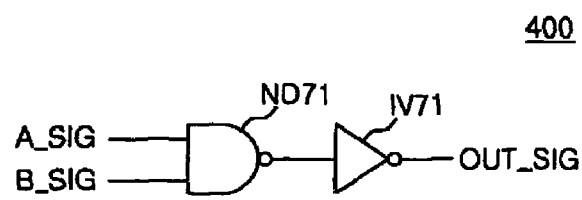
FIG. 7 is a circuit diagram of the signal generator of FIG. 5.

The signal generator 400 outputs an output signal OUT_SIG as a pulse signal in response to the first signal A_SIG and the second signal B_SIG. In FIG. 7, such a signal generator 400 may include a third NAND gate ND71, which receives the first signal A_SIG and the second signal B_SIG, and an inverter IV71, which inverts an output signal of the third NAND gate ND71, and outputs the output signal OUT_SIG.

Figure 8:
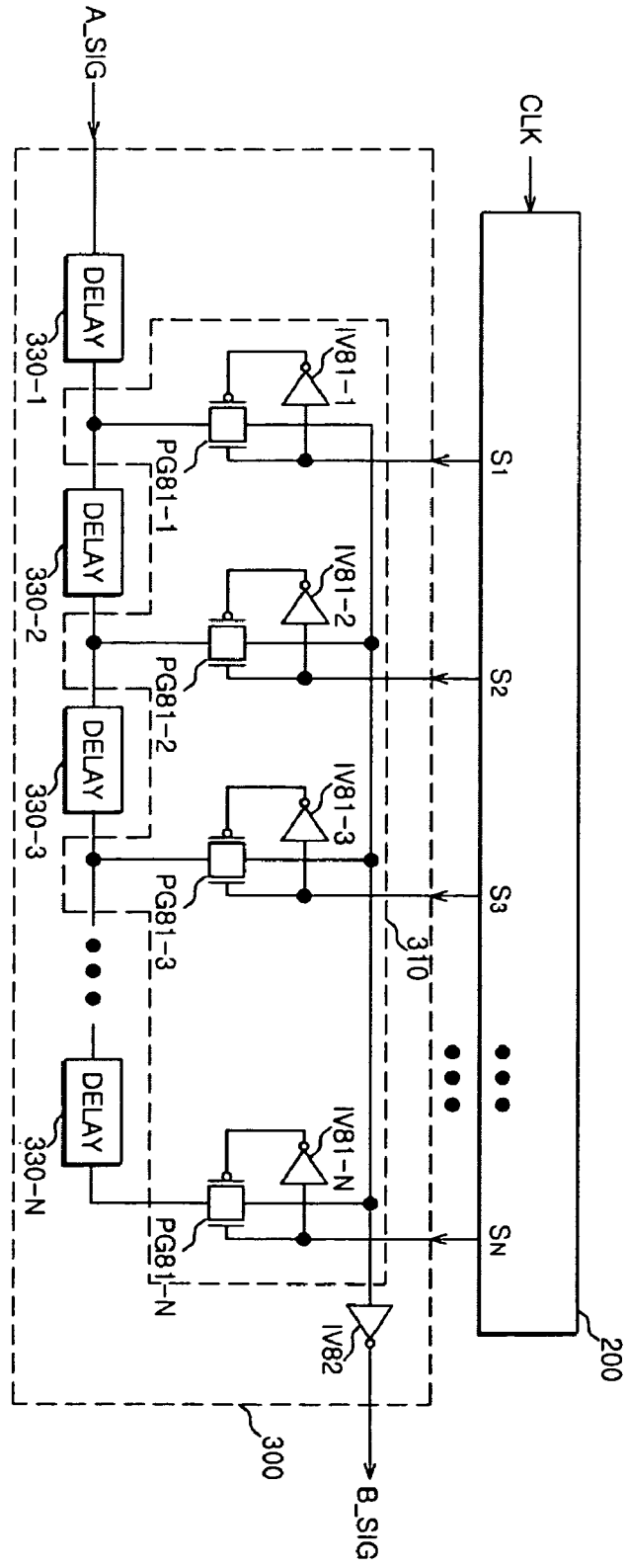
FIG. 8 is a circuit diagram of the clock period detector and the delay controller of FIG. 5.

Referring to FIG. 8, the clock period detector 200 detects the period of the external clock signal CLK to output N period detecting signals S<1:N>, and activates any one signal of the N period detecting signals S<1:N> in response to the period of the external clock signal CLK.

That is, when the external clock signal CLK is set to have a period of 0.5 ns ranging from 0.5 ns to 10 ns, each of 20 period detecting signals S<1:20> corresponding to the period of the external clock CLK is activated. For example, the first period detecting signal S1 is activated when the detected period of the external clock signal CLK is 0.5 ns, and the second period detecting signal S2 is activated when the detected period of the external clock signal CLK is 1 ns. In this case, N denotes a natural number equal to or greater than 2.

The delay controller 300 may include: N delay parts 330-1 to 330-N receiving the first signal A_SIG and sequentially delaying the first signal; a first switching part 310 connecting any one of output terminals of the delay parts 330-1 to 330-N to a common node in response to the period detecting signals S<1:N>; and an inverter IV82 of which an input terminal is connected to the common node and an output terminal outputs the second signal B_SIG.

The first switching part 310 may include pass gates PG81-1 to PG81-N which respond to the period detecting signals S<1:N> and period detecting signals S<1:N> inverted by the corresponding inverters IV81-1 to IV81-N.

The delay controller 300 serially connects the delay parts 330-1 to 330-N which receives the first signal A_SIG and sequentially delaying the first signal to each other, and turns on any one of the pass gates PG81-1 to PG81-N in response to the period detecting signals S<1:N> to connect an output terminal of a predetermined delay part of the delay parts 330-1 to 330-N to the common node.

The pass gates PG81-1 to PG81-N, disposed in the first switching part 310, may also be replaced by other switching devices responding to the respective period detecting signals S<1:N>.

Figure 9:
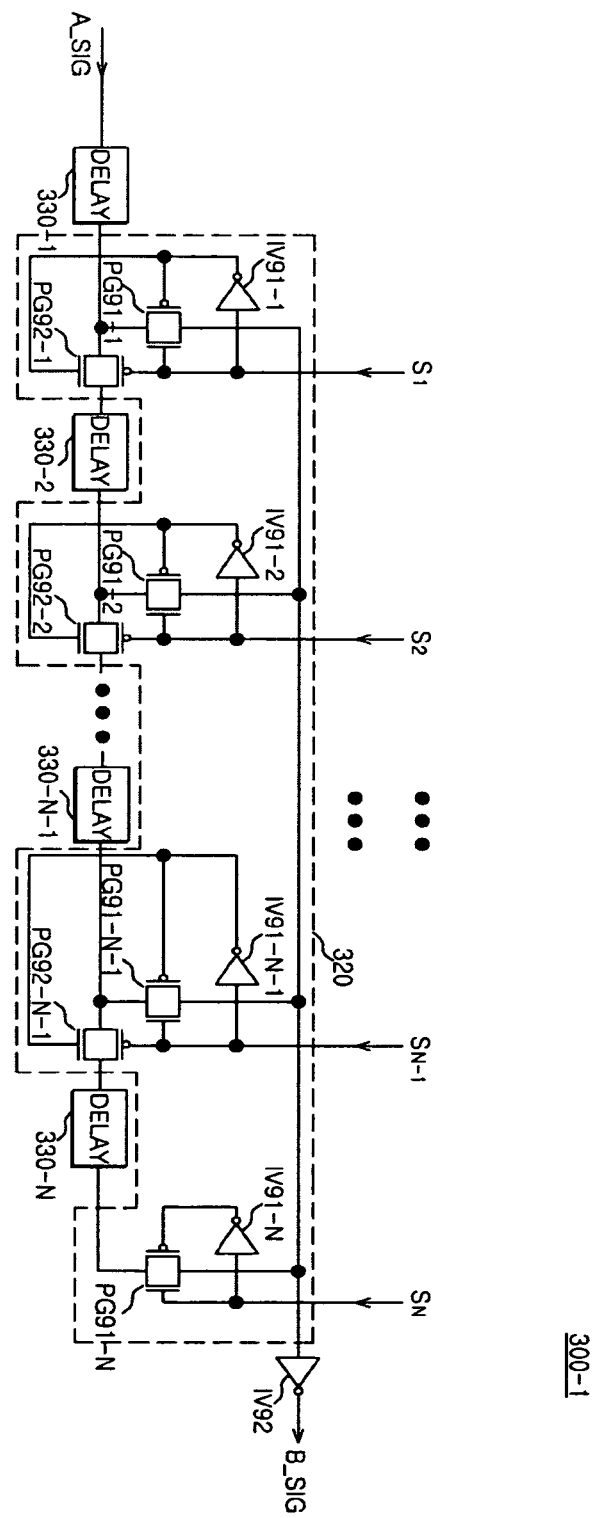
FIG. 9 is a circuit diagram illustrating another example of the delay controller of FIG. 8.

Referring to FIG. 9, the delay controller 300-1 may include the N delay parts 330-1 to 330-N which receive the first signal A_SIG and sequentially delaying the first signal; a second switching part 320 connecting an output terminal of a predetermined delay part of the N delay parts 330-1 to 330-N to the common node in accordance with the N period detecting signals S<1:N> and disconnecting the delay parts connected to each other after the output terminal of the predetermined delay part from the common node, and an inverter IV92 of which an input terminal is connected to the common node and an output terminal outputs the second signal B_SIG.

The second switching part 320 may include first pass gates PG91-1 to PG91-N and second pass gates PG92-1 to PG92-N−1 which respond to the N period detecting signals S<1:N> and the N period detecting signals S<1:N> inverted by the inverters IV91-1 to IV91-N, respectively.

The first pass gates PG91-1 to PG91-N−1 and the second pass gates PG92-1 to PG92-N−1 constitute respective pairs to selectively respond to the period detecting signals S<1:N−1>, and the first pass gate PG91-N responds to the rest one period detecting signal S<N>.

The first pass gates PG91-1 to PG91-N−1 and the second pass gates PG92-1 to PG92-N−1, constituting the respective pairs with the first pass gates PG91-1 to PG91-N−1, may be replaced by switching devices responding to the period detecting signals S<1:N−1>. In this case, the second switching part 320 uses the first pass gates PG91-1 to PG91-N−1 and the second pass gates PG92-1 to PG92-N−1 as two switching devices in the present embodiment, however, the second switching part is not limited thereto, and may also be comprised of three switching devices.

The delay controller 300-1 has the delay parts 330-1 to 330-N serially connected to each other and receiving the first signal A_SIG and sequentially delaying the first signal. In addition, one of the first pass gates PG91-1 to PG91-N is turned on in accordance with the period detecting signal S<1:N> so that an output terminal of the one of the delay parts 330-1 to 330-N is connected to the common node.

In addition, in response to the N−1 period detecting signals S<1:N−1>, delay parts connected to each other after the second pass gate which is inactivated among the second pass gates PG92-1 to PG92-N−1, are disabled.

Operations of the pulse generating apparatus according to the present invention will be described with reference to FIGS. 5 to 9.

The latch circuit 100 receives the second signal B_SIG as a feedback signal to latch the input signal IN_SIG, thereby outputting the first signal A_SIG. The clock period detector 200 detects the period of the external clock signal CLK to output N period detecting signals S<1:N>, and activates one of the period detecting signals S<1:N> in response to the period of the external clock signal CLK.

Hereinafter, a description will be given assuming that the second period detecting signal S<2> of the period detecting signals S<1:N> is an activated signal. However, it can also be understood that the activation of the present invention is not limited to the second period detecting signal S<2> only.

The delay controller 300, in response to the period detecting signal S<3>, delays and inverts the first signal A_SIG to output the second signal B_SIG.

Operations of the delay controller will be described with reference to FIG. 8.

When the second period detecting signal S<2> of signals output from the clock period detector 200 is activated, the second period detecting signal S<2> has a high level, and the rest period detecting signals S<1> and S<3:N> have a low level.

The first signal A_SIG is sequentially delayed by the delay parts 330-1 to 330-N, however, only the pass gate PG81-2 responding to the second period detecting signal S<2> is turned on. Accordingly, the first signal A_SIG is delayed by the two delay parts 330-1 and 330-2 to be output to the common node, and the first signal A_SIG of the common node is inverted by the inverter IV82 and outputted as the second signal B_SIG.

That is, the clock period detector 200 activates a different signal among the period detecting signals S<1:N> in response to the period of the external clock signal CLK. Accordingly, the delay controller 300 receiving the period detecting signals S<1:N> can adjust the delay time of the first signal A_SIG and output it as the second signal B_SIG.

Operations of the delay controller 300 will be described with reference to FIG. 9.

When the second period detecting signal S<2> is outputted from the clock period detector 200, the second period detecting signal S<2> has a high level, and the other period detecting signals S<1> and S<3:N> have a low level.

The first pass gate PG91-1, responding to the first period detecting signal S<1>, is turned off and the second pass gate PG92-1, constituting a pair with the first pass gate PG91-1, is turned on so that the second pass gate PG92-1 outputs the first signal A_SIG, delayed by the first delay part 330-1, to the second delay part 330-2.

In this case, the first pass gate PG91-2, responding to the second period detecting signal S<2>, is turned on and the second pass gate PG92-2, constituting a pair with the first pass gate PG91-2, is turned off. That is, the output terminal of the second delay part 330-2 is connected to the common node and the first signal A_SIG is delayed by the first delay part 330-1 and the second delay part 330-2 before being output as the second signal B_SIG through the inverter IV92. In addition, the delay parts 330-3 to 330-N, connected to each other after the second delay part 330-2, are disabled so that unnecessary currents can be reduced.

The delay controller 300 of FIG. 8 delays the first signal A_SIG by the N delay parts regardless of the period detecting signal S<2> when the first signal A_SIG is applied to the delay controller, so that unnecessary currents were consumed by the delay parts 330-3 to 330-N. However, the delay controller 300-1 of FIG. 9 delays the first signal A_SIG in response to the period detecting signal S<2> when the first signal A_SIG is applied to the delay controller, and turns off the second pass gate PG92-2 to disable the delay parts 330-3 to 330-N connected to each other after the second pass gate PG92-2, so that unnecessarily consumed currents can be reduced.

That is, the clock period detector 200 activates a different signal (i.e, activated timing) among the N period detecting signals S<1:N> in accordance with the period of the external clock signal CLK, so that the delay controller 300-1 receiving the period detecting signals S<1:N> can adjust the delay time of the first signal A_SIG to output the second signal B_SIG.

The signal generator 400, in FIG. 5, combines the first signal A_SIG with the second signal B_SIG to generate an output signal OUT_SIG as a pulse signal.

Figure 10:
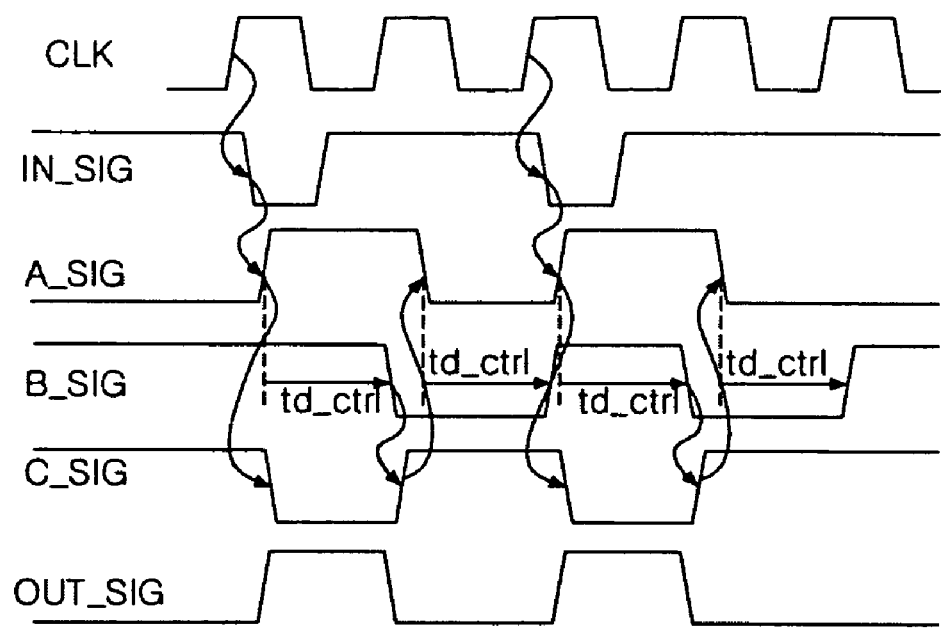
FIG. 10 is a timing diagram illustrating the operation of a pulse generating apparatus according to an embodiment of the present invention.

FIG. 10 is a timing diagram illustrating the operation of a pulse generating apparatus according to the present invention.

The following description will be given assuming that the input signal IN_SIG, the second signal B_SIG, and the third signal C_SIG have initial values at the high level, the first signal A_SIG and the output signal OUT_SIG have initial values at the low level, and the input signal IN_SIG is synchronized with the external clock signal CLK to be input as a pulse of low level per two cycles.

When the input signal IN_SIG is input, the latch circuit 100 inverts the input signal IN_SIG and outputs the first signal A_SIG at a high level. The first signal A_SIG is then delayed by a predetermined time td_ctrl and inverted by the delay controller 300 to be output as the second signal B_SIG.

The first signal A_SIG was delayed by a fixed delay time td_ctrl and then inverted to be output as the second signal B_SIG regardless of the period of the external clock signal CLK in accordance with the conventional art. Accordingly, when the period of the external clock signal CLK is short, a pulse output signal OUT_SIG may not be output when the next input signal IN_SIG was coming in. The pulse generating apparatus of the present invention, however, as shown in FIG. 10, delays the first signal A_SIG by the predetermined time td_ctrl by means of the delay controller 300 to output it as the second signal B_SIG, so that the signal generator 400 can stably output the output signal OUT_SIG as a pulse signal.

According to the pulse generating apparatus and method of an embodiment of the present invention as described above, the clock period detector 200 activates one of the N period detecting signals S<1:N> in accordance with the period of the external clock signal CLK, and the delay controller 300 or 300-1 properly adjust the delay time of the first signal A_SIG, so that the output signal OUT_SIG having a normal pulse can be stably generated even when the period of the external clock signal CLK is short.

According to the pulse generating apparatus and method of an embodiment of the present invention as described above, a delay time of a signal for generating an internal signal in response to a period of an external clock signal can be flexibly adjusted, so that the internal signal can be stably generated even when the period of the external clock signal is short.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A pulse generating apparatus, comprising:
   a latch circuit latching an input signal to output a first signal;
   a clock period detector detecting a period of an external clock signal to output a period detecting signal;
   a delay controller adjusting a delay time of the first signal to output a second signal in response to the period detecting signal; and
   a signal generator receiving the first signal and the second signal to output a pulse signal.

2. The pulse generating apparatus as set forth in claim 1, wherein the second signal is input to the latch circuit as a feedback signal.

3. The pulse generating apparatus as set forth in claim 2, wherein the latch circuit outputs the first signal which is enabled in response to the input signal and is disabled in response to the second signal.

4. The pulse generating apparatus as set forth in claim 3, wherein the latch circuit comprises a first logic device and a second logic device which constitute a latch structure.

5. The pulse generating apparatus as set forth in claim 4, wherein the first logic device receives the input signal and a third signal, which is an output signal of the second logic device, to output the first signal.

6. The pulse generating apparatus as set forth in claim 5, wherein the second logic device receives the second signal and the first signal to output the third signal.

7. The pulse generating apparatus as set forth in claim 6, wherein the first logic device and the second logic device are NAND gates.

8. The pulse generating apparatus as set forth in claim 2, further comprising N period detecting signals, where N is a natural number equal to or greater than 2, and wherein the clock period detector, in response to the external clock signal, activates and outputs only one signal of N period detecting signals according to the period of the external clock signal.

9. The pulse generating apparatus as set forth in claim 8, wherein the delay controller comprises N delay parts, each having an input and an output terminal, which receive and sequentially delay the first signal, and a switching part connecting the output terminal of a predetermined delay part of the N delay parts to a common node in response to the N period detecting signals.

10. The pulse generating apparatus as set forth in claim 9, wherein the switching part comprises N switching devices.

11. The pulse generating apparatus as set forth in claim 10, wherein the switching devices have input terminals connected to the output terminals of the N delay parts and output terminals connected to the common node.

12. The pulse generating apparatus as set forth in claim 11, wherein the switching devices are pass gates.

13. The pulse generating apparatus as set forth in claim 12, wherein the delay controller comprises an inverter receiving a signal output from the common node and outputting the second signal.

14. The pulse generating apparatus as set forth in claim 8, wherein the delay controller comprises N delay parts, having input and output terminals, which receive and sequentially delay the first signal, and a switching part connecting the output terminal of a predetermined delay part of the N delay parts to a common node in response to the N period detecting signals and disconnecting the delay parts from the common node.

15. The pulse generating apparatus as set forth in claim 14, wherein the switching part comprises a set of N−1 switching devices and a first switching device, which respond to the N period detecting signals, respectively.

16. The pulse generating apparatus as set forth in claim 15, wherein each of the N−1 switching devices comprises the first switching device and a second switching device constituting a pair with the first switching device.

17. The pulse generating apparatus as set forth in claim 16, wherein the second switching device of each of the N−1 switching devices is inactivated when the first switching device is activated.

18. The pulse generating apparatus as set forth in claim 17, wherein the first switching devices have input terminals, connected to the output terminals of the delay parts, and output terminals connected to the common node.

19. The pulse generating apparatus as set forth in claim 18, wherein the second switching device of each of the N−1 switching device is connected between an input terminal of the first switching device and the input terminal of the delay part next to the delay part corresponding to the first switching device.

20. The pulse generating apparatus as set forth in claim 19, wherein the first switching device and the second switching device are pass gates.

21. The pulse generating apparatus as set forth in claim 20, wherein the delay controller further comprises an inverter receiving a signal output from the common node and outputting the second signal.

22. The pulse generating apparatus as set forth in claim 8, wherein the signal generator comprises a NAND gate receiving the first signal and the second signal to produce an output signal, and an inverter inverting the output signal of the NAND gate and outputting the inverted signal.

23. A pulse generating method, comprising:
   latching an input signal to output a first signal;
   detecting a period of an external clock signal to output a plurality of period detecting signals;
   adjusting a delay time of the first signal to output a delayed second signal in response to the plurality of period detecting signals; and
   generating a pulse signal in response to the first signal and the second signal.

24. The method as set forth in claim 23, wherein the input signal is synchronized with the external clock signal.

25. The method as set forth in claim 23, wherein the second signal is input as a feedback signal.

26. The method as set forth in claim 23, wherein outputting the period detecting signals comprises activating and outputting a specific period detecting signal, of the plurality of period detecting signals, in response to the period of the external clock signal.

27. The method as set forth in claim 26, wherein outputting the second signal comprises making the delay time of the first signal different according to the specified period detecting signal to output the delayed first signal as the second signal.

28. The method as set forth in claim 27, wherein generating the pulse signal comprises logically combining the first signal with the second signal to output the pulse signal.

* * * * *